(12) United States Patent
Kono et al.

(10) Patent No.: US 8,487,403 B2
(45) Date of Patent: Jul. 16, 2013

(54) SEMICONDUCTOR DEVICE

(75) Inventors: Kazushi Kono, Tokyo (JP); Takeshi Iwamoto, Tokyo (JP); Hisayuki Kato, Tokyo (JP); Shigeki Obayashi, Tokyo (JP); Toshiaki Yonezu, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 342 days.

(21) Appl. No.: 12/878,977

(22) Filed: Sep. 9, 2010

(65) Prior Publication Data

US 2011/0006392 A1    Jan. 13, 2011

Related U.S. Application Data

(60) Continuation of application No. 12/869,323, filed on Aug. 26, 2010, which is a division of application No. 11/958,360, filed on Dec. 17, 2007, now Pat. No. 7,808,076.

(30) Foreign Application Priority Data

Jan. 10, 2007   (JP) ................................ 2007-002685

(51) Int. Cl.
*H01L 29/00*    (2006.01)
(52) U.S. Cl.
USPC ............. 257/529; 257/E23.149; 257/E21.529
(58) Field of Classification Search
USPC ..................................... 257/23.149, E21.529
See application file for complete search history.

(56) References Cited

U.S. PATENT DOCUMENTS

| 6,252,292 B1 | 6/2001 | Brintzinger et al. |
| 6,566,729 B1 | 5/2003 | Okada |
| 7,378,718 B2 | 5/2008 | Tsutsui |
| 2005/0274966 A1 | 12/2005 | Matsunaga |
| 2005/0285224 A1 | 12/2005 | Tsutsui |
| 2006/0278953 A1 | 12/2006 | Shimizu |

FOREIGN PATENT DOCUMENTS

| JP | 2000-286341 A | 10/2000 |
| JP | 2001-024063 A | 1/2001 |
| JP | 2001-230325 A | 8/2001 |
| JP | 2006-013338 A | 1/2006 |
| JP | 2006-108413 A | 4/2006 |
| JP | 2006-310277 | 11/2006 |

OTHER PUBLICATIONS

Office Action issued Jun. 19, 2012, in Japanese Patent Application No. 2007-002685.
Japanese Office Action issued Nov. 13, 2012, in Japanese Patent Appln. No. 2007-002685 (and English translation).

*Primary Examiner* — Mamadou Diallo
(74) *Attorney, Agent, or Firm* — Miles & Stockbridge P.C.

(57) ABSTRACT

The semiconductor device which has an electric straight line-like fuse with a small occupying area is offered.
A plurality of projecting portions 10*f* are formed in the position shifted from the middle position of electric fuse part 10*a*, and, more concretely, are formed in the position distant from via 10*e* and near via 10*d*. A plurality of projecting portions 20*f* are formed in the position shifted from the middle position of electric fuse part 20*a*, and, more concretely, are formed in the position distant from via 20*d* and near 20*e*. That is, projecting portions 10*f* and projecting portions 20*f* are arranged in the shape of zigzag.

33 Claims, 21 Drawing Sheets

SEMICONDUCTOR DEVICE

CROSS-REFERENCE TO RELATED APPLICATION

This application is a continuation of application Ser. No. 12/869,323 filed Aug. 26, 2010, which is a division of application Ser. No. 11/958,360 filed Dec. 17, 2007 now U.S. Pat. No. 7,808,076. The present application also claims priority from Japanese patent application No. 2007-2685 filed on Jan. 10, 2007, the content of which is hereby incorporated by reference into this application.

1. FIELD OF THE INVENTION

The present invention relates to the semiconductor device which has an electric fuse cut when using a redundant circuit.

2. DESCRIPTION OF THE BACKGROUND ART

It may be detected from the former that the defect occurred in the memory cell in the wafer process. In this case, the memory cell of the spare formed as a redundant circuit is used instead of a defective memory cell.

A fuse is used for the switch from the state which uses the above-mentioned defective memory cell to the state which uses a spare memory cell. Generally as a fuse for this switch, the laser fuse cut by irradiating a laser beam from the outside is used.

When a laser fuse is used, before a resin seal is completed, it is necessary to irradiate laser at a fuse in the state where a semiconductor chip is uncovered. Therefore, it is required to use a laser trimming unit apart from a semiconductor manufacturing device. A laser fuse cannot be cut after a semiconductor chip is sealed with resin.

Then, after a semiconductor chip is sealed with resin, the fuse electrically cut by sending current has been developed as a means for the above-mentioned switch.

As a method for the above-mentioned switch, how to cut a wiring by sending current through a wiring, how to destroy a capacitor by applying the high voltage to a capacitor, how to destroy a gate insulating layer by applying the high voltage to a gate oxide film, and the way memory of a flash memory realizes the above-mentioned switch etc. can be considered. Hereafter, the method of cutting a wiring by sending current through a wiring is explained among these methods.

The fuse with which a wiring is cut by sending current through a wiring is called an electric fuse in this specification. As how to cut an electric fuse, in addition to a method using the electromigration phenomenon of an electric fuse known from the former, all, such as a method of making the melted fuse flow into the crack of the insulating layer surrounding an electric fuse which the inventors of the present application are developing as technology which is not opened to the public, and a method of using the elasticity in the width and height direction of an electric fuse, i.e., pinch effect, are included.

[Patent Reference 1] Japanese patent laid-open No. 2006-108413
[Patent Reference 2] Japanese patent laid-open No. 2001-24063
[Patent Reference 3] Japanese patent laid-open No. 2001-230325
[Patent Reference 4] Japanese patent laid-open No. 2006-13338

SUMMARY OF THE INVENTION

The above-mentioned conventional electric fuse has the following problem. As a conventional electric fuse, the electric fuse of the linear model which consists only of a straight line, and the electric clinch type fuse which consists of meandering shape which has a straight line part and a bent part are proposed. Since the electric fuse of a linear model can make an occupying area smaller than an electric clinch type fuse, it is more advantageous than an electric clinch type fuse from a viewpoint of a fuse occupying area.

However, the electric fuse of a straight line part has a large possibility of having a bad influence to the structure around an electric fuse, as compared with an electric clinch type fuse, when it is cut. For example, when the electric fuse of a straight line part is cut, the interlayer insulating layer surrounding an electric fuse will receive physical damages, such as a crack, or a thermal damage. This is a factor which obstructs making the pitch of electric fuses small.

When the width of the region which receives a damage of the surrounding insulating layer of an electric straight line-like fuse is smaller than the width of the wiring connected to each of the ends of an electric fuse, the pitch between straight line-like electric fuses is determined by the pitch of the wiring layers connected to each of the ends of an electric straight line-like fuse.

When the width of the region which receives a damage of the surrounding insulating layer of an electric straight line-like fuse is larger than the width of the wiring layer connected to each of the ends of an electric straight line-like fuse on the other hand, the pitch between straight line-like electric fuses will be determined by the width of the region which receives a damage.

Therefore, in a conventional electric straight line-like fuse, when the region which receives a damage is located in a line with straight line shape, there is a problem that it is difficult to make the pitch between electric fuses small.

When cutting an electric fuse, in order to reduce the damage given to the interlayer insulating layer around an electric fuse, it is indispensable to reduce a current value required in order to cut an electric fuse.

When a required current value is large, the occupying area of the transistor for supplying the current is also large. Therefore, it is required to reduce a current value required in order to cut an electric fuse also from a viewpoint of reducing the occupying area of the electric straight line-like fuse and the circuit relevant to it in a semiconductor chip.

In order to reduce a current value required in order to cut an electric fuse, it is required to use more efficiently the Joule's heat generated in an electric fuse for the rise of the temperature of an electric fuse. Therefore, forming a heater near the electric fuse which has crank structure, or the above electric fuses which have clinch structure is proposed.

However, since the electric fuse which has crank structure or clinch structure makes the interlayer insulating layer located outside an electric fuse generate a damage, it is inferior to the electric straight line-like fuse from a viewpoint of making the occupying area of an electric fuse small.

Since the occupying area of a heater becomes large in forming the heater for heating near the electric fuse, the occupying area of the element relevant to an electric fuse part will become large.

Also in when using the via which penetrates an interlayer insulating layer to a thickness direction as an electric fuse, since it is the same as that of the reason which cannot make small the pitch between the electric fuse parts of the shape of an above-mentioned straight line, it is difficult to make the pitch of vias small. Therefore, the occupying area of an electric fuse cannot be made small.

The present invention is made in view of an above-mentioned problem, and the purpose is to offer the semiconductor device which can make the occupying area of an electric fuse small.

The semiconductor device of an embodiment of the invention is provided with a plurality of electric straight line-like fuses prolonged in parallel mutually, each of a plurality of electric straight line-like fuses has a projecting portion, and the projecting portion group is arranged in the shape of zigzag in the plan view.

According to the semiconductor device of an embodiment of the invention, the occupying area of an electric fuse can be made small.

DETAILED DESCRIPTION OF THE PREFERRED EMBODIMENTS

Hereafter, the semiconductor device of an embodiment of the invention is explained, referring to drawings. As long as the semiconductor device of the present invention is a semiconductor device provided with the electric fuse which may be cut by sending current through a wiring or a via, it may be what kind of thing.

Generally, a semiconductor device is in the tendency that the occupying area of an electric fuse increases as memory space increases. However, since the pitch between electric fuses can be made small according to the semiconductor device of this embodiment explained below, the occupying area of an electric fuse group can be reduced. The semiconductor device of this embodiment can cut an electric fuse, without having a bad influence on a surrounding structure of an electric fuse, after a semiconductor chip is covered with resin since it has the electric fuse which may be cut with a low current value.

Embodiment 1

Figure 1:
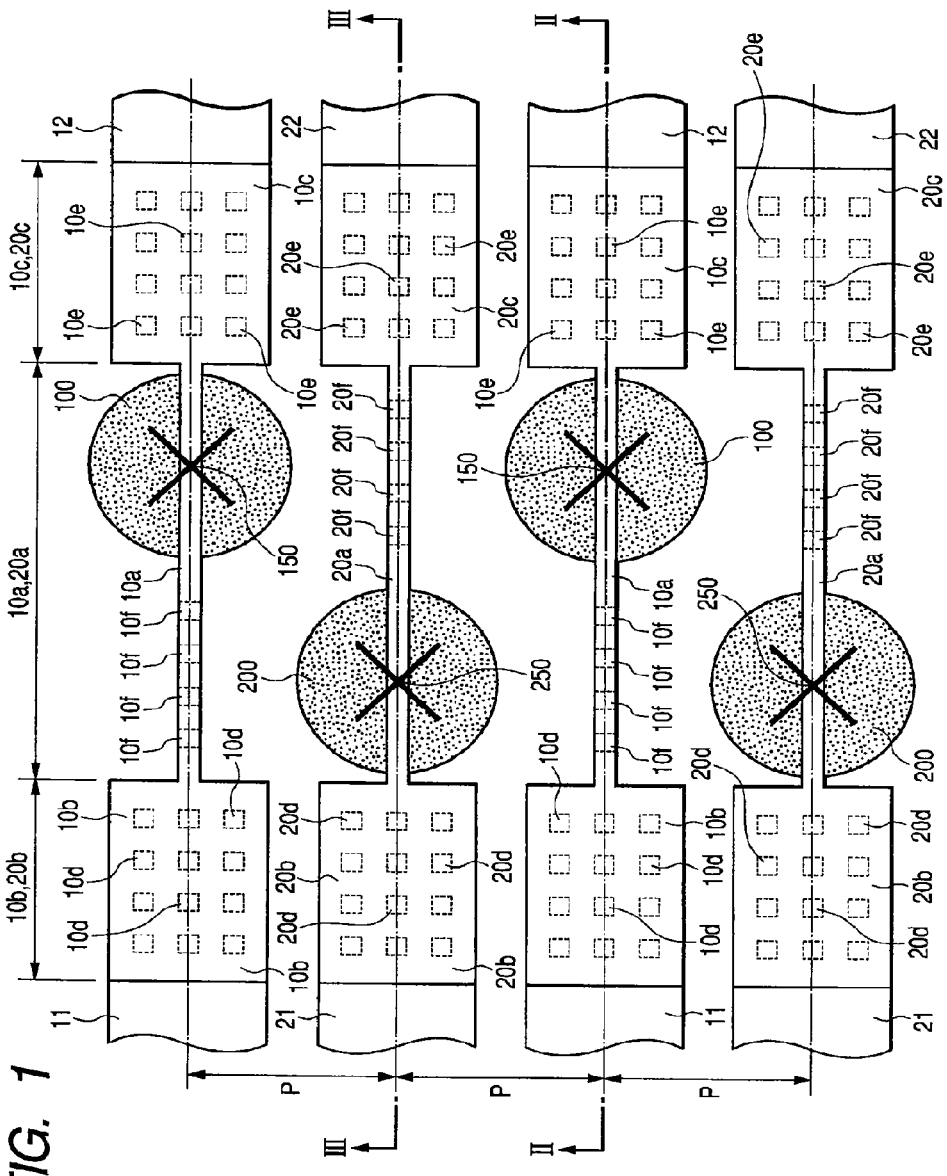
FIG. 1 is a layout drawing of the electric fuse part of Embodiment 1.
Figure 2:
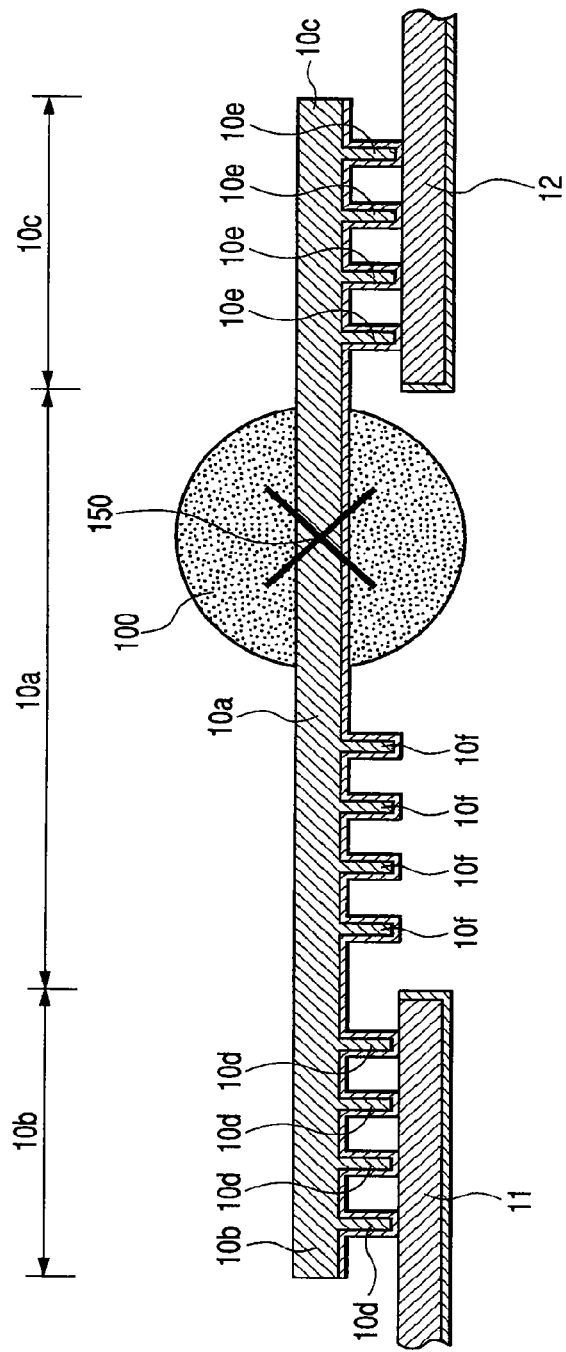
FIG. 2 is an II-II line cross-sectional view in FIG. 1.

First, the semiconductor device of Embodiment 1 is explained using FIG. 1 and FIG. 2.

The semiconductor device of this embodiment is provided with electric fuse parts 10a and 20a as shown in FIG. 1.

In electric fuse part 10a, as shown in FIG. 1 and FIG. 2, the one side end is connected to conductive part 10b, and the other side end is connected to conductive part 10c. As electric fuse part 20a is shown in FIG. 1 and FIG. 2, the one side end is connected to conductive part 20b, and the other side end is connected to conductive part 20c.

Conductive parts 10b and 20b are connected to a plurality of vias 10d and a plurality of vias 20d, respectively. A plurality of vias 10d and a plurality of vias 20d are connected to wiring layer 11 and wiring layer 21, respectively. On the other hand, conductive parts 10c and 20c are connected to a plurality of vias 10e and a plurality of vias 20e, respectively. A plurality of vias 10e and a plurality of vias 20e are connected to wiring layer 12 and wiring layer 22, respectively.

Electric fuse part 10a has a plurality of projecting portions 10f in which each has the same form as via 10d or via 10e. Electric fuse part 20a is connected to a plurality of projecting portions 20f in which each has the same form as via 20d or via 20e.

In order that explanation of the interlayer insulating layer formed around electric fuse parts 10a and 20a, conductive parts 10b and 20b, conductive parts 10c and 20c, vias 10d and 20d, vias 10e and 20e, and projecting portions 10f and 20f is simple, it is not drawn on each drawing.

The holes where projecting portions 10f and 20f, vias 10d and 20d, and vias 10e and 20e are embedded are simultaneously formed in an interlayer insulating layer in the same etching step.

As shown in FIG. 2, a plurality of projecting portions 10f are formed in the position shifted from the middle position of electric fuse part 10a, more concretely, in the position distant from via 10e and near via 10d. A plurality of projecting portions 10f have the function to make the heat generated in electric fuse part 10a diffuse. Therefore, as for electric fuse part 10a, position 150 becomes the highest temperature so that it may be cut in position 150 distant from via 10d and near via 10e. Therefore, the interlayer insulating layer located in periphery 100 of position 150 receives the biggest damage.

Figure 3:
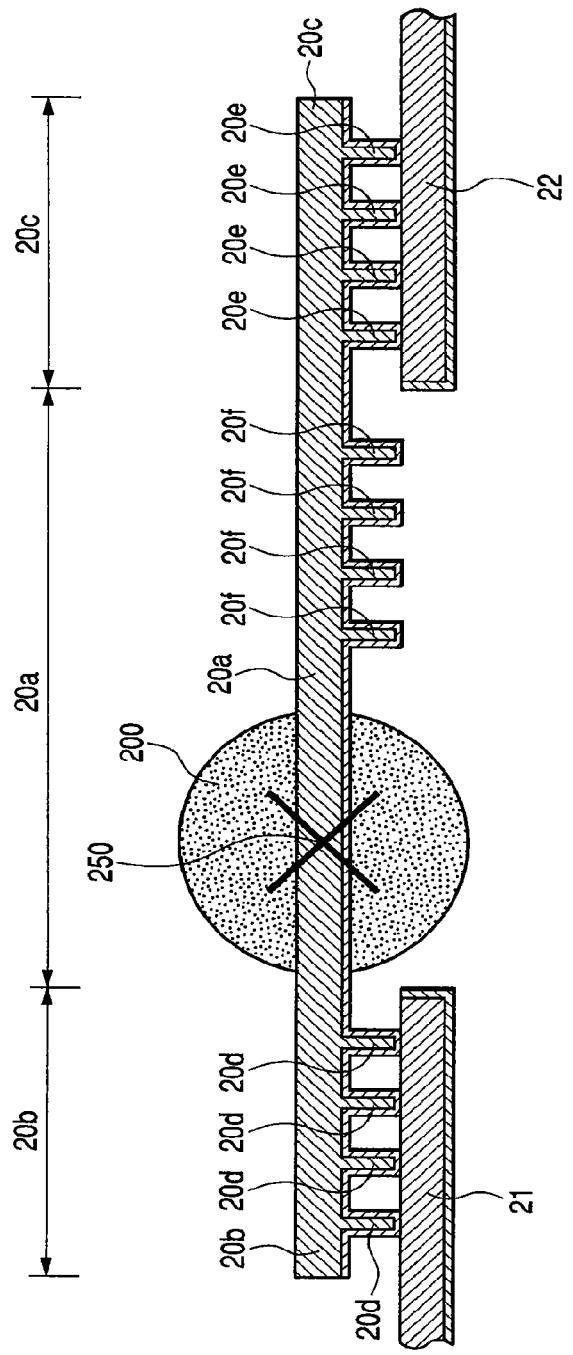
FIG. 3 is an III-III line cross-sectional view in FIG. 1.

As shown in FIG. 3, a plurality of projecting portions 20f are formed in the position shifted from the middle position of electric fuse part 20a, more concretely, in the position distant from via 20d and near via 20e. A plurality of projecting portions 20f have the function to make the heat generated in electric fuse part 20a diffuse. Therefore, as for electric fuse part 20a, cut position 250 becomes the highest temperature so that it may be cut in cut position 250 distant from via 20e and near via 20d. Therefore, the interlayer insulating layer located in periphery 200 of cut position 250 receives the biggest damage.

Supposing electric fuse parts 10a and 20a, conductive parts 10b, 10c, 20b, and 20c connected to them, vias 10d, 10e, 20d, and 20e and projecting portions 10f and 20f compose a unit structural body, in the semiconductor device of this embodiment, this unit structural body is formed repeatedly. Therefore, projecting portions 10f and projecting portions 20f are arranged in the shape of zigzag. Electric fuse part 10a and electric fuse part 20a are formed always separating pitch P.

Generally, when the electric straight line-like fuse part is used and width of the conductive part connected to the electric fuse part is made small, the pitch between electric fuse parts is restricted by the damaged part of the surrounding interlayer insulating layer of the cut position of an electric fuse part, i.e., the size of periphery 100 and 200 etc. Therefore, when it arranges so that peripheries 100 and 200 may be located in a line in the shape of a straight line, the pitch between electric fuse parts cannot be made small. Then, in the semiconductor device of this embodiment, a plurality of projecting portions 10f and a plurality of projecting portions 20f are arranged in the shape of zigzag so that peripheries 100 and 200 may be arranged in the shape of zigzag seeing in plan view. As a result, pitch P between electric fuse part 10a and electric fuse part 20a can be reduced as much as possible.

Figure 4:
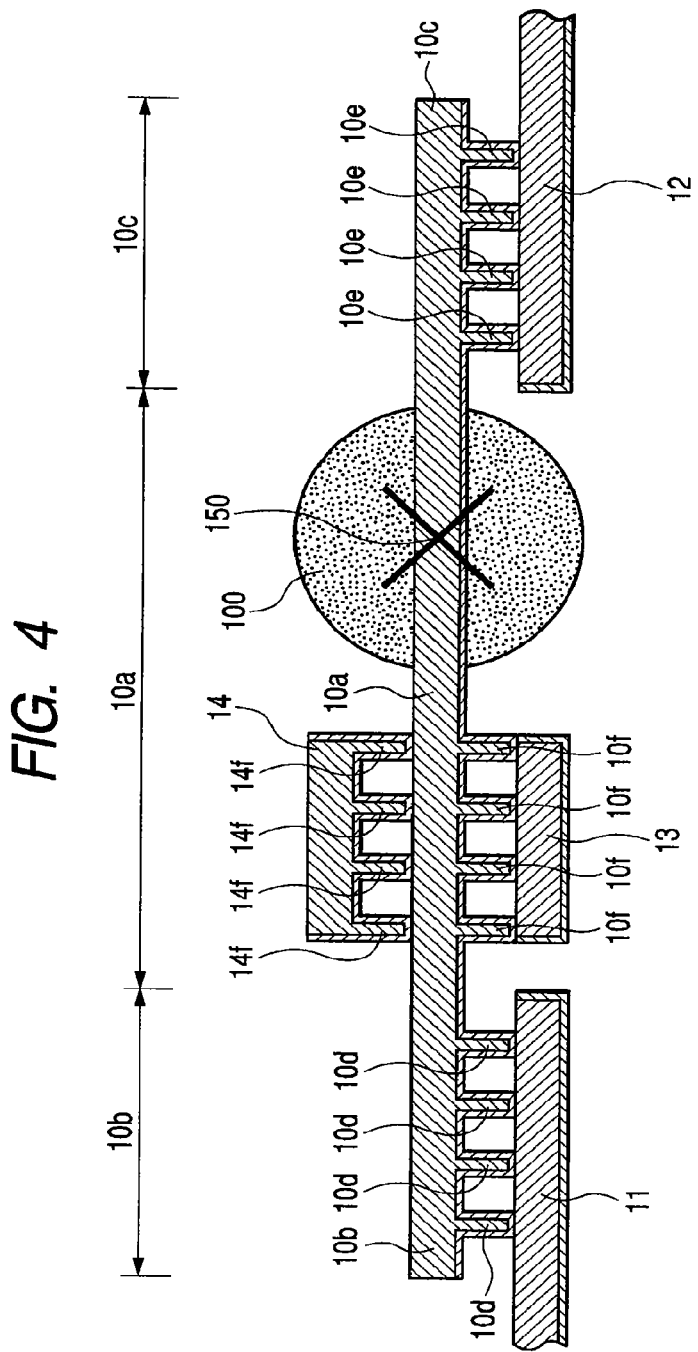
FIG. 4 is a cross-sectional view of the electric fuse part of the modification of Embodiment 1.

As shown in FIG. 4, when wiring layer 13 connected to each of a plurality of projecting portions 10f is formed in the same layer as wiring layers 11 and 12, the radiation performance in projecting portions 10f can be improved more.

When projecting portions 14f are formed also in electric fuse part 10a and 20a upper part, the radiation performance in the portion can be improved more. However, when projecting portions 14f are formed in electric fuse part 10a upper part, the manufacturing process of a semiconductor device will increase. The occupation ratio within a semiconductor device of electric fuse part 10a will increase.

Therefore, in this embodiment, as shown in FIG. 2 and FIG. 3, a plurality of projecting portions 10f and 20f which consist of a plurality of vias are formed only in electric fuse part 10a and 20a lower part. Since projecting portions 10f and 20f are formed in the same layer as vias 10d, 10e, 20d, and 20e in the same step according to this, there are not an increase in the occupation ratio of the structural body which forms electric fuse parts 10a and 20a, and an increase in the step for manufacturing electric fuse parts 10a and 20a.

Embodiment 2

Figure 5:
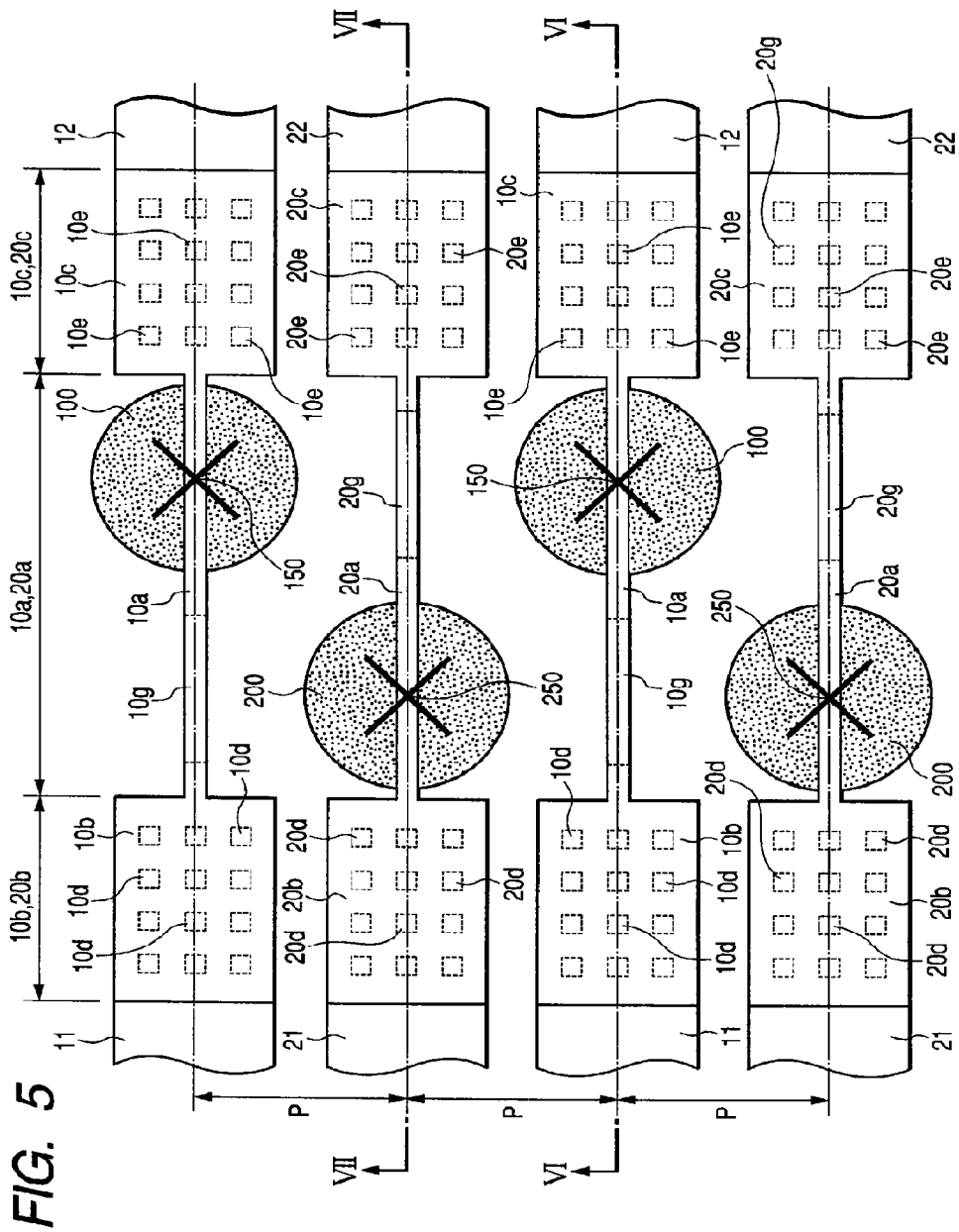
FIG. 5 is a layout drawing of the electric fuse part of Embodiment 2.
Figure 6:
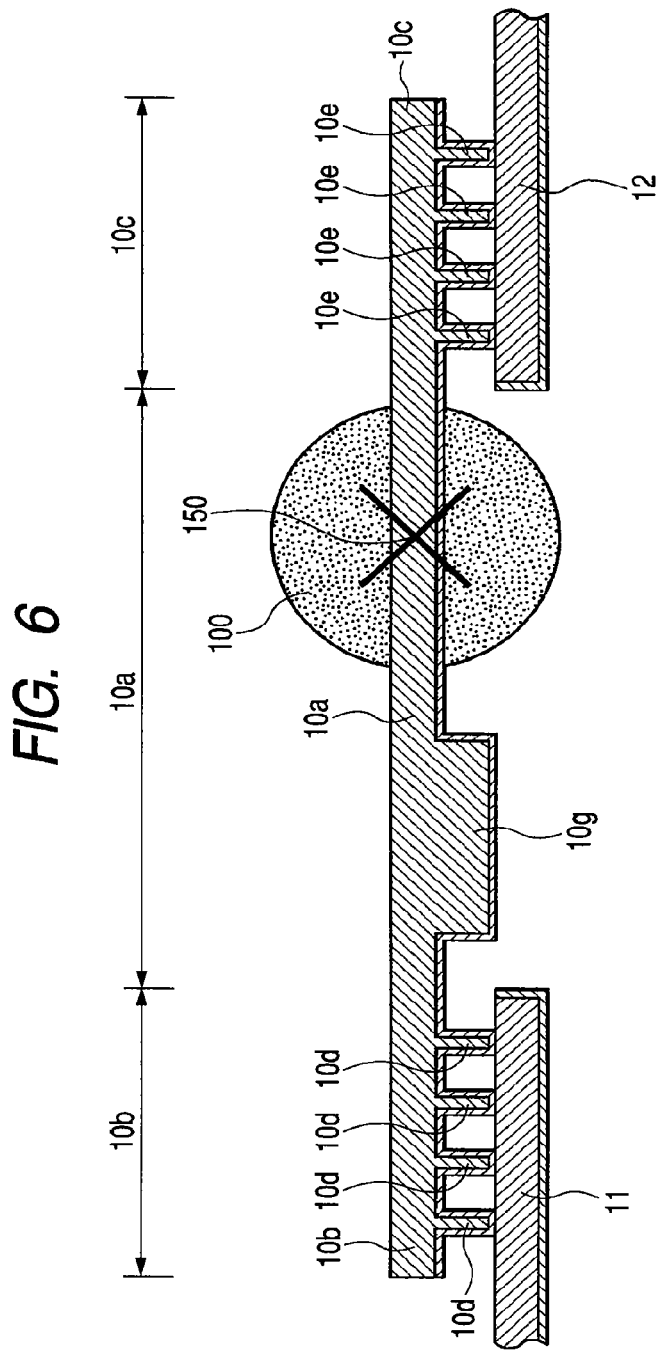
FIG. 6 is a VI-VI line cross-sectional view in FIG. 5.
Figure 7:
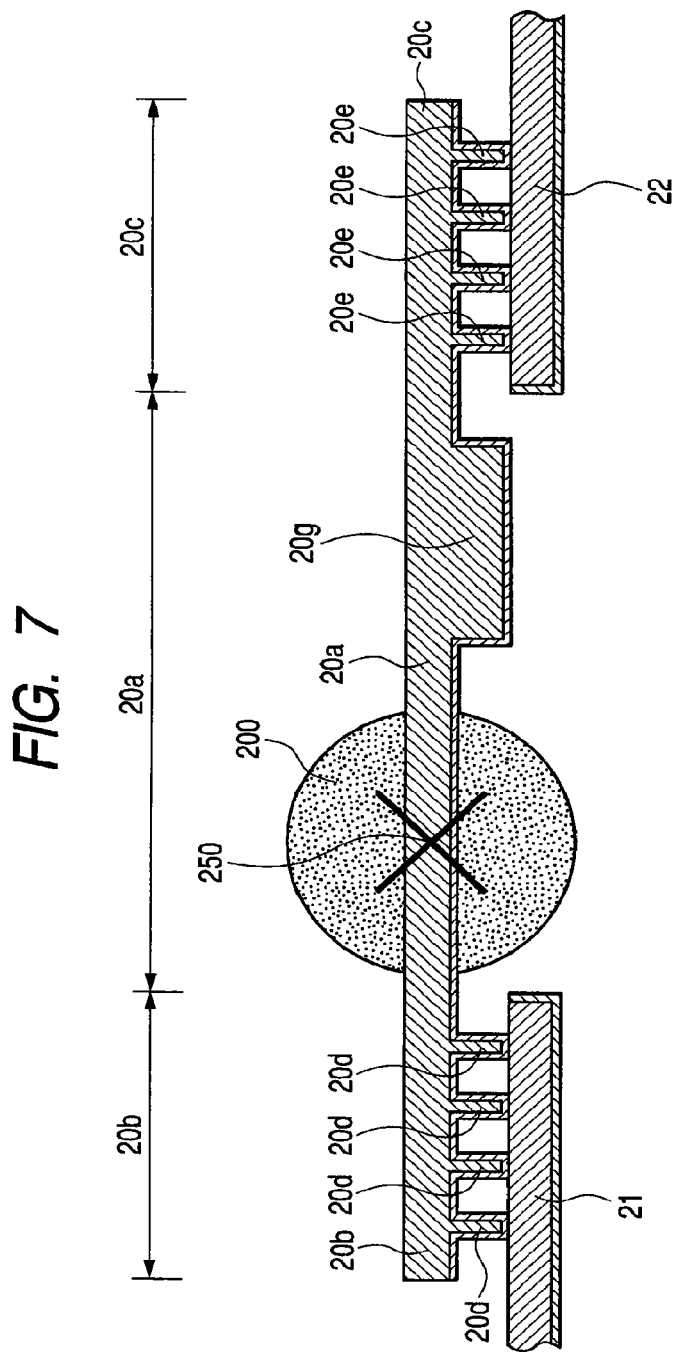
FIG. 7 is a VII-VII line cross-sectional view in FIG. 5.

Next, the semiconductor device of an embodiment of the invention is explained using FIG. 5-FIG. 7.

The structure of the semiconductor device of this embodiment is almost the same as the structure of the semiconductor device of Embodiment 1. Therefore, in the semiconductor device of this embodiment, the same referential mark as the referential mark used in Embodiment 1 is attached to the part which has the same structure and the same function as a semiconductor device of Embodiment 1.

As shown in FIG. 5-FIG. 7, the semiconductor device of this embodiment differs from the semiconductor device of Embodiment 1 in the point that wiring parts 10g and 20g are respectively formed in electric fuse part 10a and 20a lower part instead of a plurality of projecting portions 10f and 20f of Embodiment 1.

According to this, projecting portion 10g which consist of one lump have bigger volume than the whole of a plurality of projecting portions 10f. Therefore, the radiation efficiency of a projecting portion increases.

The current density of projecting portions 10g and 20g is lower than the current density of a plurality of projecting portions 10f and 20f respectively. Therefore, the Joule's heat itself which raises the temperature of electric fuse parts 10a and 20a is reduced. As a result, the bad influence to peripheries 100 and 200 of electric fuse parts 10a and 20a is inhibited.

Figure 8:
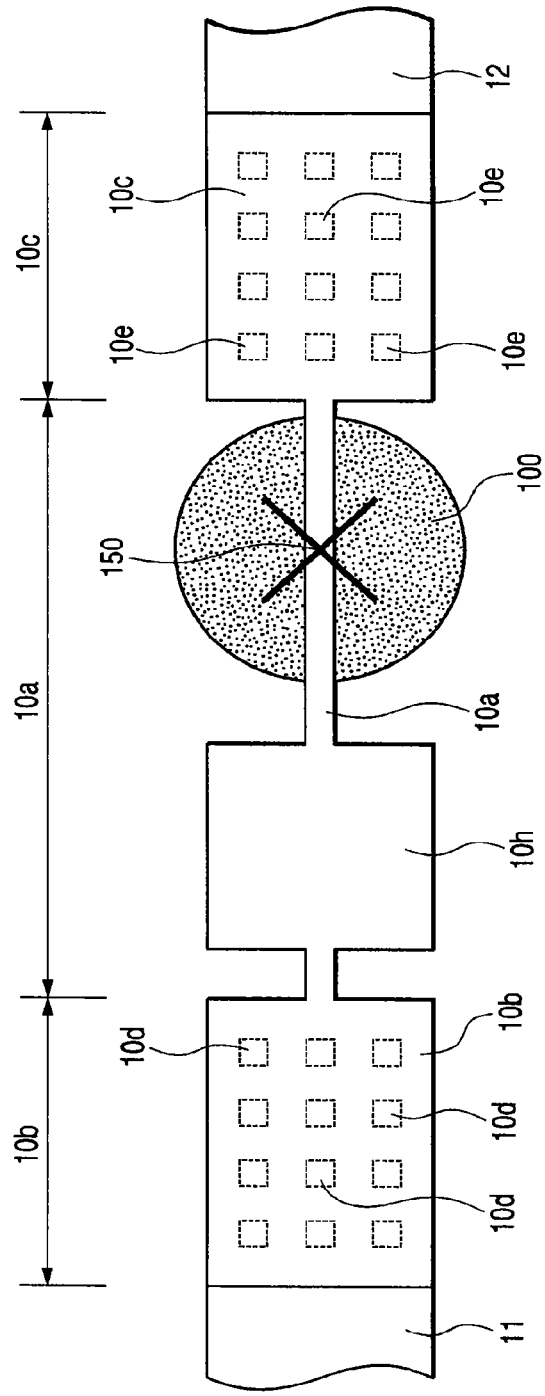
FIG. 8 is a cross-sectional view of the electric fuse part of the modification of Embodiment 2.

Instead of projecting portion 10g which projects from electric fuse part 10a to the down side, as shown in FIG. 8, projecting portion 10h which projects in both sides of electric fuse part 10a may be formed. Also by this, the same effect as the effect acquired by projecting portions 10f can be acquired. In this case, although not illustrated, the same projecting portion 20h as projecting portion 10h has projected from the both side surfaces of electric fuse part 20a.

Embodiment 3

Next, with reference to FIG. 9-FIG. 15, the semiconductor device of Embodiment 3 of the present invention is explained.

Figure 9:
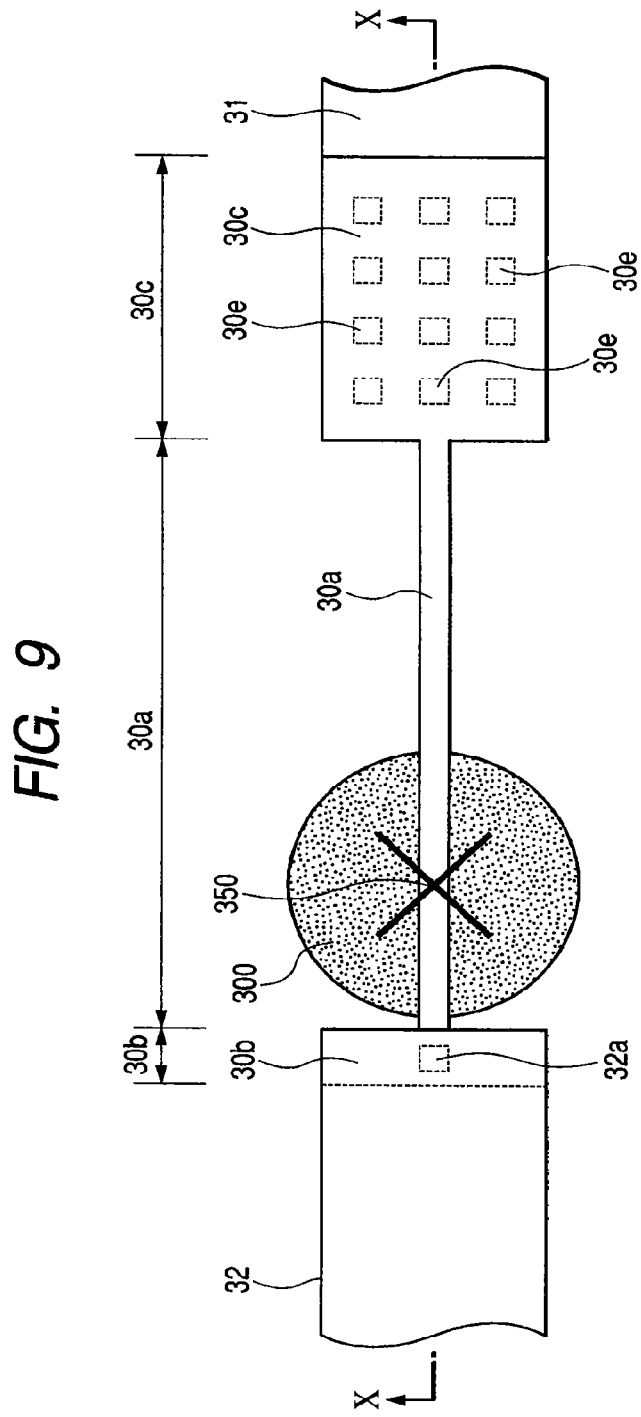
FIG. 9 is a top view of the unit structure of the electric fuse part of Embodiment 3.
Figure 10:
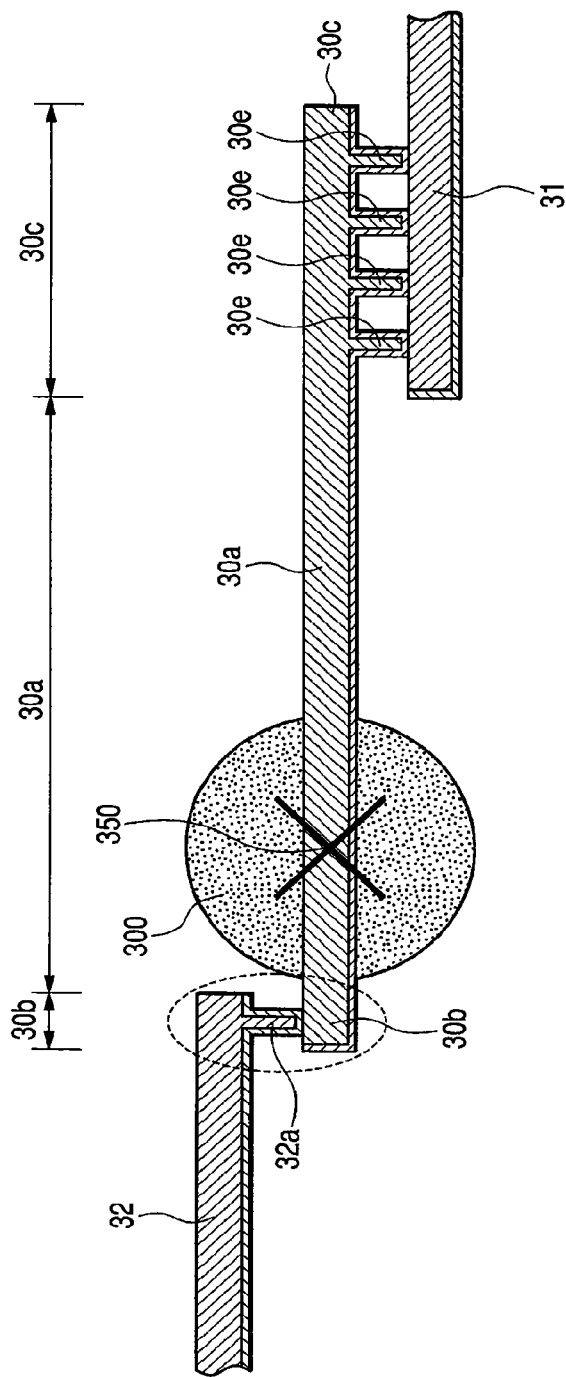
FIG. 10 is a X-X line cross-sectional view in FIG. 9.
Figure 11:
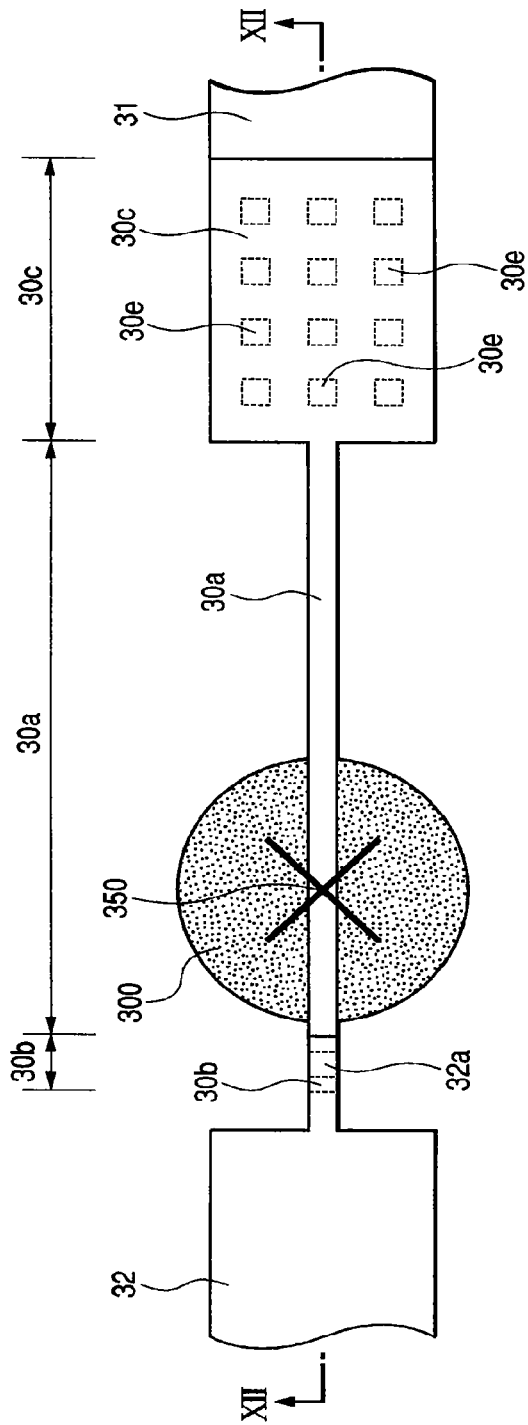
FIG. 11 is a top view of the unit structure of the electric fuse part of the modification of Embodiment 3.

First, an example of the unit structure of the electric fuse part of the semiconductor device of this embodiment and its modification are explained using FIG. 9-FIG. 11.

In electric fuse part 30a, the one side end is connected to wiring layer 30b, and the other side end is connected to wiring layer 30c. A plurality of vias 30e are connected to wiring layer 30c. Wiring layer 30b, electric fuse part 30a, wiring layer 30c, and via 30e are formed in one. Lower-layer wiring layer 31 is connected to via 30e. Via 32a is connected to wiring layer 30b. Via 32a is formed in one with the upper wiring layer 32.

In this embodiment, in order to heighten the exothermic effect with the same current value, as shown in FIG. 9 and FIG. 10, wiring layer 30b and the upper wiring layer 32 are connected by only one via 32a.

The cross-section area of via 32a is smaller than the cross-section area of a plurality of vias 30e. Therefore, the calorific value of via 32a is larger than the calorific value of a plurality of vias 30e.

Therefore, according to the semiconductor device of this embodiment, temperature of electric fuse part 30a near the via 32a can be made higher than the temperature near a plurality of vias 30e. Therefore, cut position 350 and its periphery 300 can be inclined and formed in the via 32a side from the middle position of electric fuse part 30a.

Figure 12:
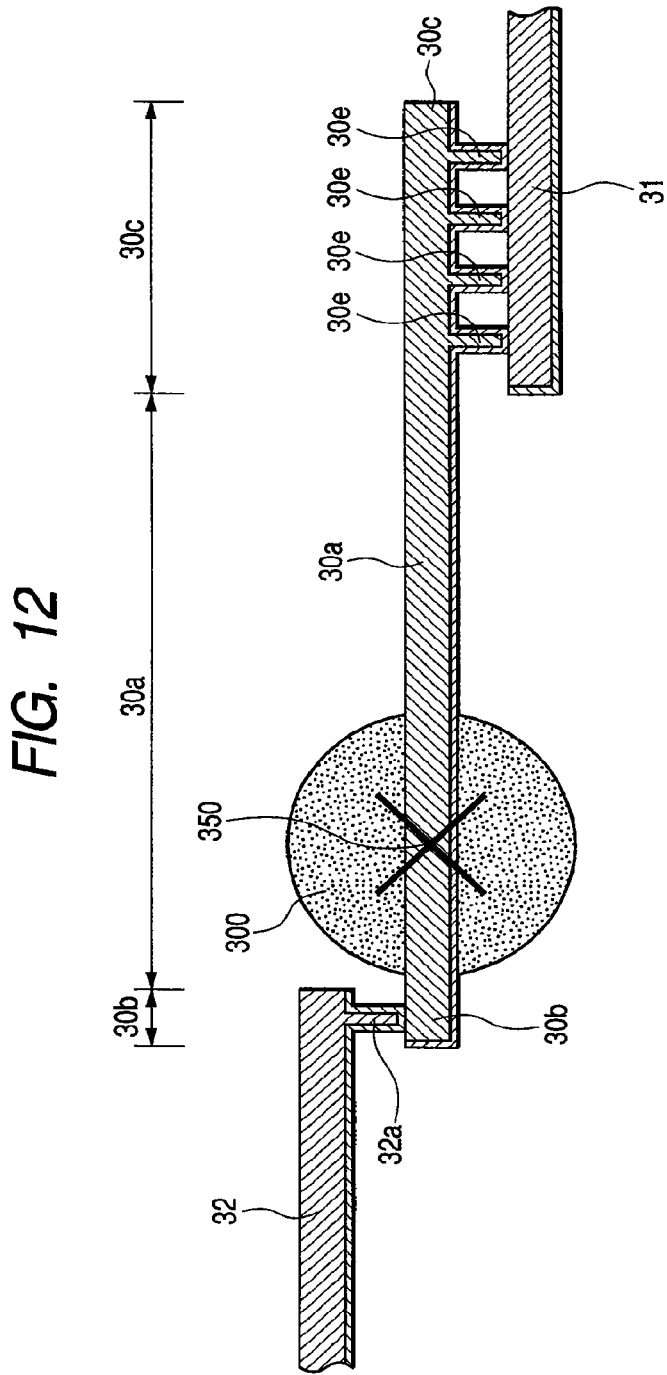
FIG. 12 is a XII-XII line cross-sectional view in FIG. 11.

As shown in FIG. 11 and FIG. 12, it is desirable for a part of upper wiring layer 32 of the position connected to via 32a to be thinner than other portions. According to this, it is possible to heighten the heater effect near the via 32a more.

Figure 13:
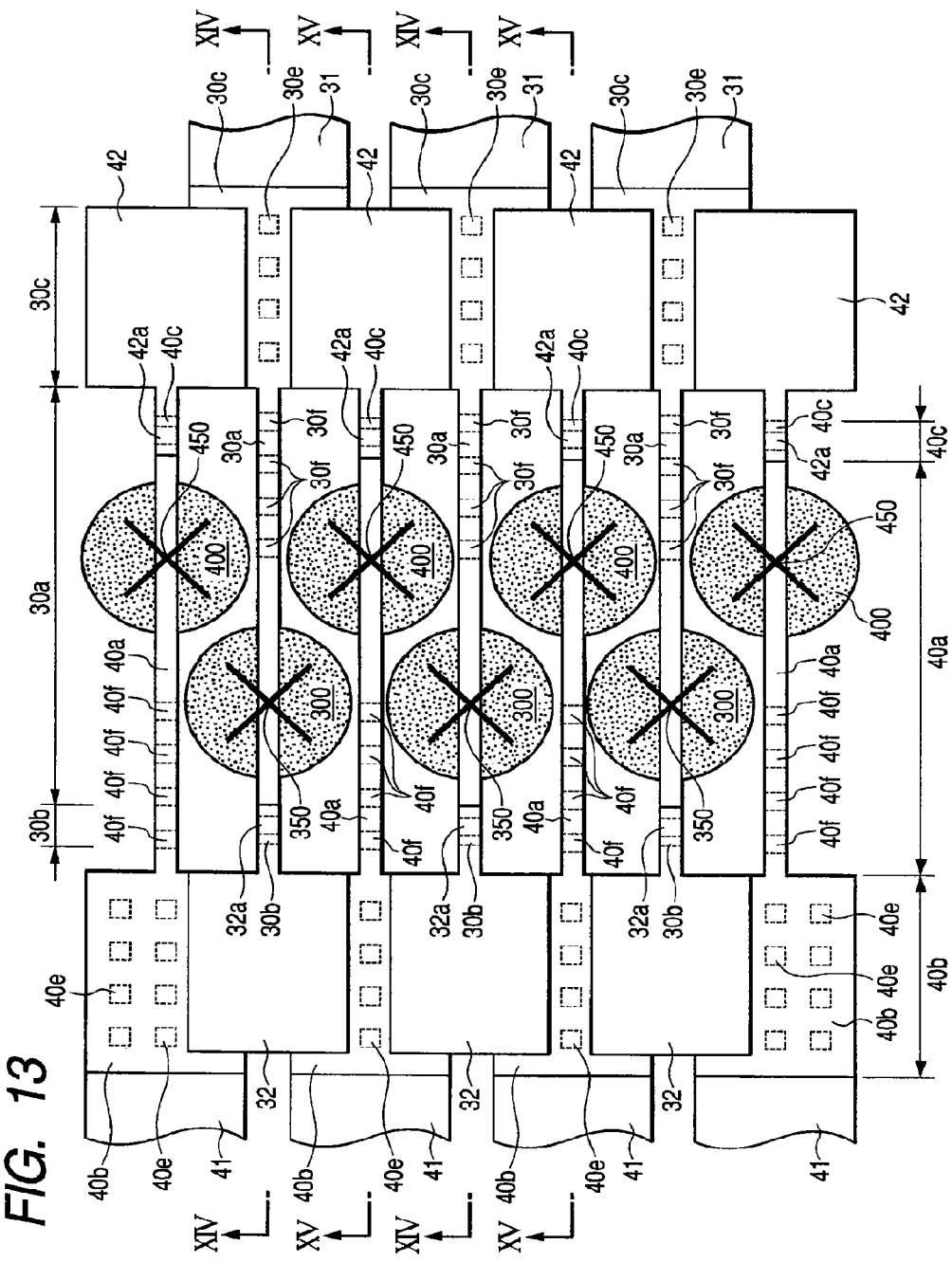
FIG. 13 is a layout drawing of the electric fuse part of Embodiment 3.
Figure 14:
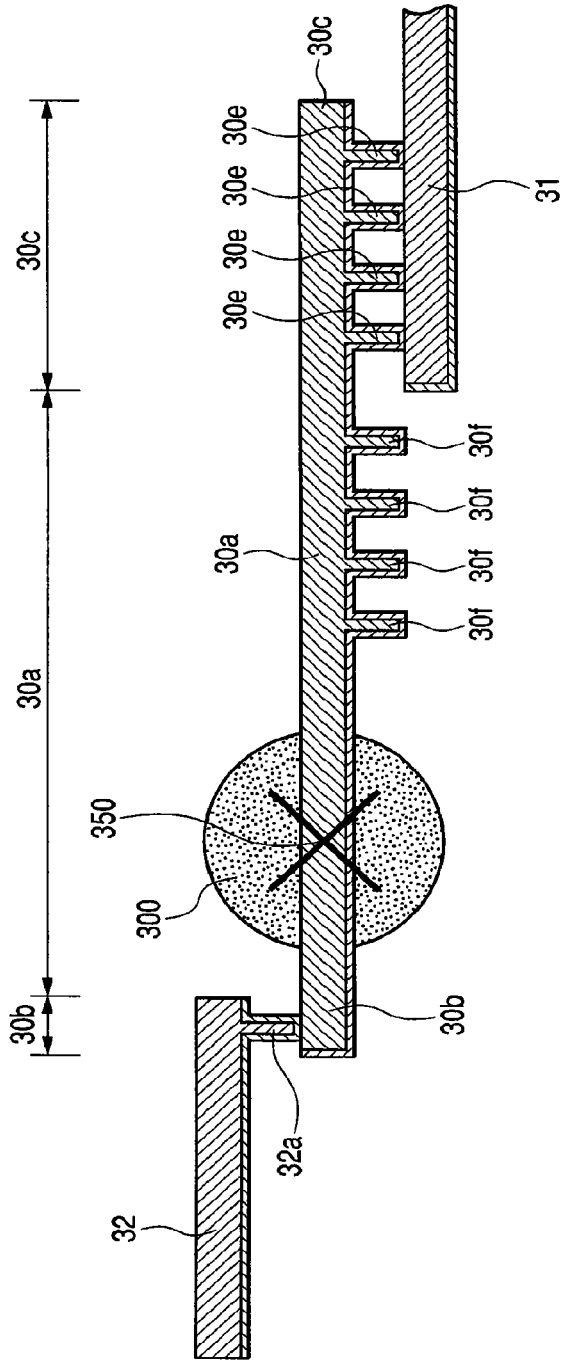
FIG. 14 is a XIV-XIV line cross-sectional view in FIG. 13.
Figure 15:
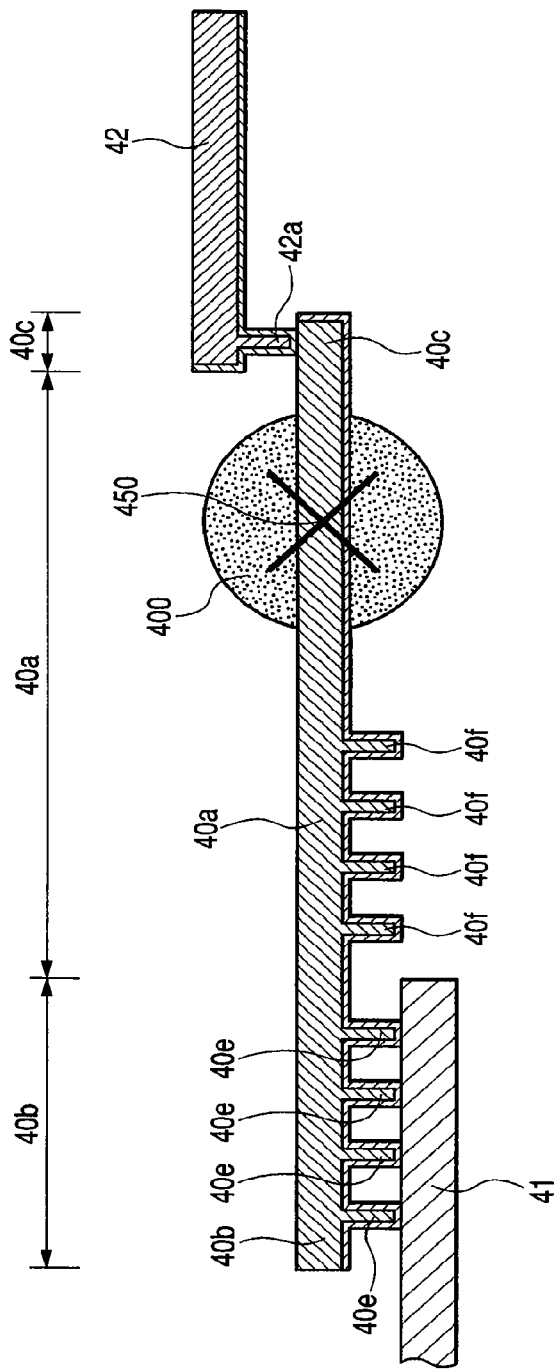
FIG. 15 is a XV-XV line cross-sectional view in FIG. 13.

Next, the structure of the electric fuse part of the semiconductor device of this embodiment is explained using FIG. 13-FIG. 15. Although the unit structure of an electric fuse part is different from the unit structure of an electric fuse part shown in FIG. 9-FIG. 12, in the arrangement of an electric fuse part shown in FIG. 13, the unit structure of an electric fuse part shown in FIG. 9-FIG. 12 may be used.

As for electric fuse part 30a, as shown in FIG. 13 and FIG. 14, the one side end is connected to wiring layer 30b, and the other side end is connected to wiring layer 30c. Via 32a is connected to wiring layer 30b. Via 32a is formed in one with the upper wiring layer 32. Wiring layer 30c is connected to a plurality of vias 30e formed in one. A plurality of vias 30e are connected to lower-layer wiring layer 31. A plurality of projecting portions 30f have projected in the lower part from electric fuse part 30a. A plurality of projecting portions 30f are formed in the position which inclined toward the wiring layer 30c side rather than the middle position of electric fuse part 30a.

The cross-section area of via 32a is smaller than the cross-section area of a plurality of vias 30e. Therefore, the calorific value of via 32a is larger than the calorific value of a plurality of vias 30e. Therefore, according to the semiconductor device of this embodiment, temperature of electric fuse part 30a near the via 32a can be made higher than the temperature near a plurality of vias 30e. Therefore, cut position 350 and its periphery 300 can be inclined and formed in the via 32a side from the middle position of electric fuse part 30a.

A part of upper wiring layer 32 of the position connected to via 32a is thinner than other portions. Therefore, the resistance of the upper wiring layer 32 near the position connected to via 32a is smaller than the resistance of other portions. According to this, it is possible to heighten the heater effect near the via 32a more.

As for electric fuse part 40a, as shown in FIG. 13 and FIG. 15, the one side end is connected to wiring layer 40b, and the other side end is connected to wiring layer 40c. Via 42a is connected to wiring layer 40c. Via 42a is formed in one with the upper wiring layer 42. Wiring layer 40b is formed in one with a plurality of vias 40e. A plurality of vias 40e are connected to lower-layer wiring layer 41. A plurality of projecting portions 40f have projected in the lower part from electric fuse part 40a. A plurality of projecting portions 40f are formed in the position which inclined toward the wiring layer 40b side rather than the middle position of electric fuse part 40a.

The cross-section area of via 42a is smaller than the cross-section area of a plurality of vias 40e. Therefore, the calorific value of via 42a is larger than the calorific value of a plurality of vias 40e. Therefore, according to the semiconductor device of this embodiment, temperature of electric fuse part 40a near the via 42a can be made higher than the temperature near a plurality of vias 40e. Therefore, cut position 450 and its periphery 400 can be inclined and formed in the via 42a side from the middle position of electric fuse part 40a.

The upper wiring layer 42 near the position connected to via 42a is thinner than other portions. Therefore, the resistance of the upper wiring layer 42 near the position connected to via 42a is smaller than the resistance of other portions. According to this, it is possible to heighten the heater effect near the via 42a more.

According to the semiconductor device of this embodiment, as shown in FIG. 13, the fuse unit shown in FIG. 14 and FIG. 15 is formed repeatedly. Thereby, a plurality of projecting portions 30f and a plurality of projecting portions 40f are arranged in the shape of zigzag. Therefore, cut position 350 (periphery 300) of electric fuse part 30a and cut position 450 (periphery 400) of electric fuse part 40a will also be arranged in the shape of zigzag. Therefore, by the same effect as the effect acquired by the semiconductor device of Embodiment 1 and 2, it becomes possible to reduce pitch P between electric fuse part 30a and electric fuse part 40a. While lower-layer wiring layer 41 and the upper wiring layer 32 are formed so that they may overlap in a plan view as shown in FIG. 13, lower-layer wiring layer 31 and the upper wiring layer 42 are formed so that they may overlap in a plan view. Therefore, the restrictions which pitch P between lower-layer wiring layers and pitch P between the upper wiring layers receive by each width of the upper wiring layers 32 and 42 and lower-layer wiring layers 31 and 41 are eased.

Even if a plurality of projecting portions 30f and 40f are not formed, cut positions 350 and 450 can be zigzag formed according to a difference of the cross-section area between via 32a and a plurality of vias 30e, and a difference of the cross-section area between via 42a and a plurality of vias 40e. In this embodiment, the width of upper wiring layer 32 near the via 32a and upper wiring layer 42 near the via 42a is smaller than other portions. However, as for the semiconductor device of this embodiment, even if upper wiring layer 32 near the via 32a and upper wiring layer 42 near the via 42a have the same width as other portions, according to a difference of the cross-section area between via 32a and a plurality of vias 30e, and a difference of the cross-section area between via 42a and a plurality of vias 40e, cut positions 350 and 450 can be formed zigzag.

A difference of the cross-section area between vias 32a and 42a and a plurality of vias 30e and 40e is an example of a difference of the resistance between vias 32a and 42a and a plurality of vias 30e and 40e. A difference of the resistance between vias 32a and 42a and a plurality of vias 30e and 40e may be brought about by other structures.

Embodiment 4

Next, the semiconductor device of Embodiment 4 of the present invention is explained using FIG. 16-FIG. 20.

In the semiconductor device of this embodiment, the via vertically prolonged to a semiconductor substrate functions as an electric fuse part.

Electric fuse part 1070 consists of a via prolonged in the vertical direction to the main surface of a semiconductor substrate in the semiconductor device of this embodiment. As for electric fuse part 1070, as shown in FIG. 16-FIG. 19, the one side end is connected to wiring layer 1060 of the same width as electric fuse part 1070, and the other side end is connected to wiring layer 1080 of the same width as electric fuse part 1070. Wiring layer 1050 which has bigger width than wiring layer 1060 is connected to wiring layer 1060. On the other hand, wiring layer 1050, wiring layer 1060, and electric fuse part 1070 are formed in one. Wiring layer 1080 is connected to wiring layer 1090 which has bigger width than wiring layer 1080. Wiring layers 1080 and 1090 are formed in one.

As for electric fuse part 1170, as shown in FIG. 16-FIG. 19, the one side end is connected to wiring layer 1160 of the same width as electric fuse part 1170, and the other side end is connected to wiring layer 1180 of the same width as electric fuse part 1170. Wiring layer 1150 which has bigger width than wiring layer 1160 is connected to wiring layer 1160. On the other hand, wiring layer 1150, wiring layer 1160, and electric fuse part 1170 are formed in one. Wiring layer 1180 is connected to wiring layer 1190 which has bigger width than wiring layer 1180. Wiring layers 1180 and 1190 are formed in one.

Figure 16:
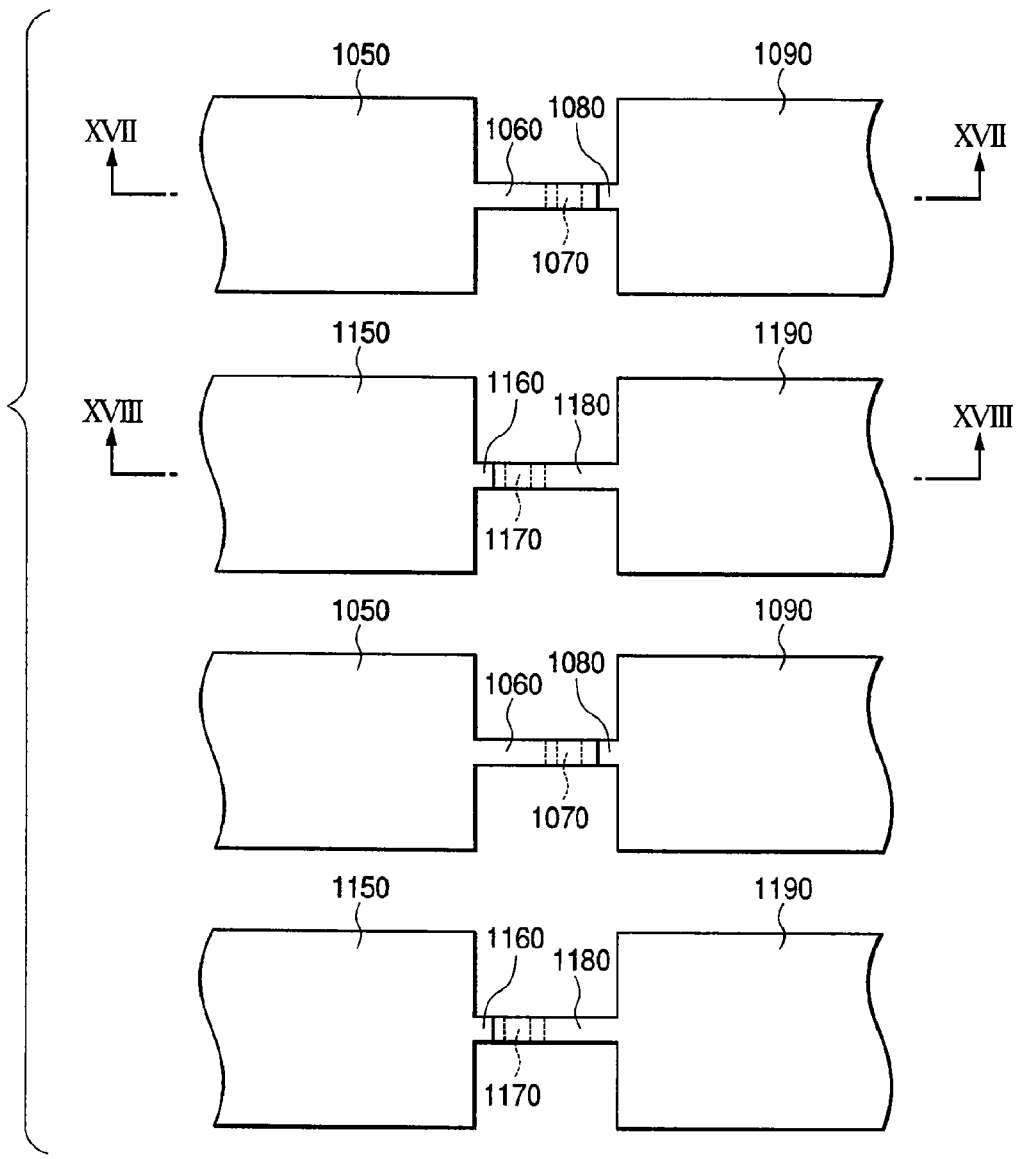
FIG. 16 is a top view of the electric fuse part of Embodiment 4.
Figure 17:
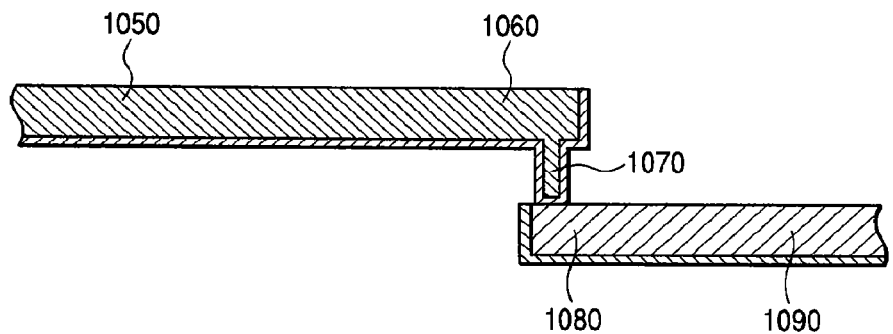
FIG. 17 is a XVII-XVII line cross-sectional view in FIG. 16.
Figure 18:
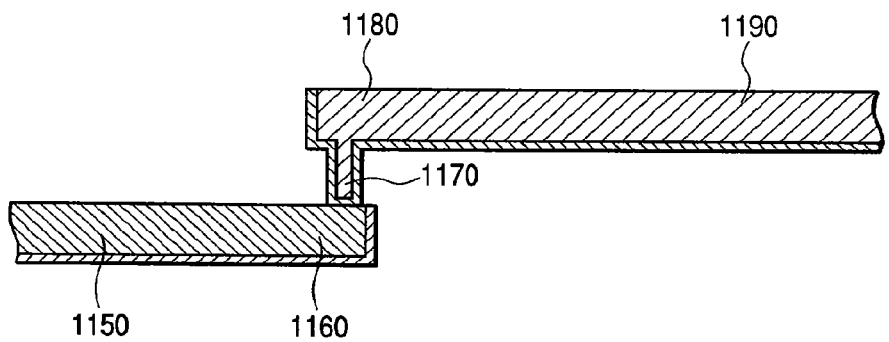
FIG. 18 is a XVIII-XVIII line cross-sectional view in FIG. 16.
Figure 19:
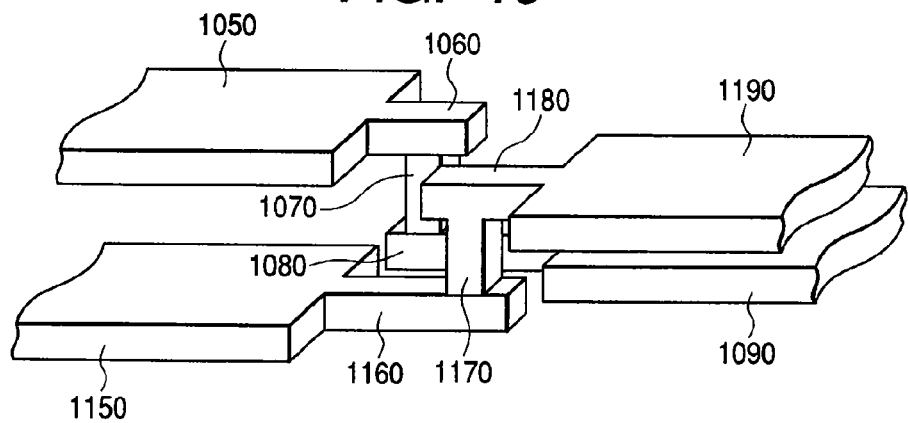
FIG. 19 is a perspective view of the electric fuse part of Embodiment 4.

According to the semiconductor device of this embodiment, as shown in FIG. 16, the fuse unit shown in FIG. 17 and FIG. 18 is formed repeatedly. Seeing in plan view, electric fuse part 1070 and electric fuse part 1170 are arranged in the shape of zigzag. Therefore, the cut position of electric fuse part 1070 and the cut position of electric fuse part 1170 will be arranged in the shape of zigzag seeing in plan view. Therefore, by the same effect as the effect acquired by the semiconductor device of Embodiments 1-3, it becomes possible to reduce pitch P between electric fuse part 1070 and electric fuse part 1170.

Figure 20:
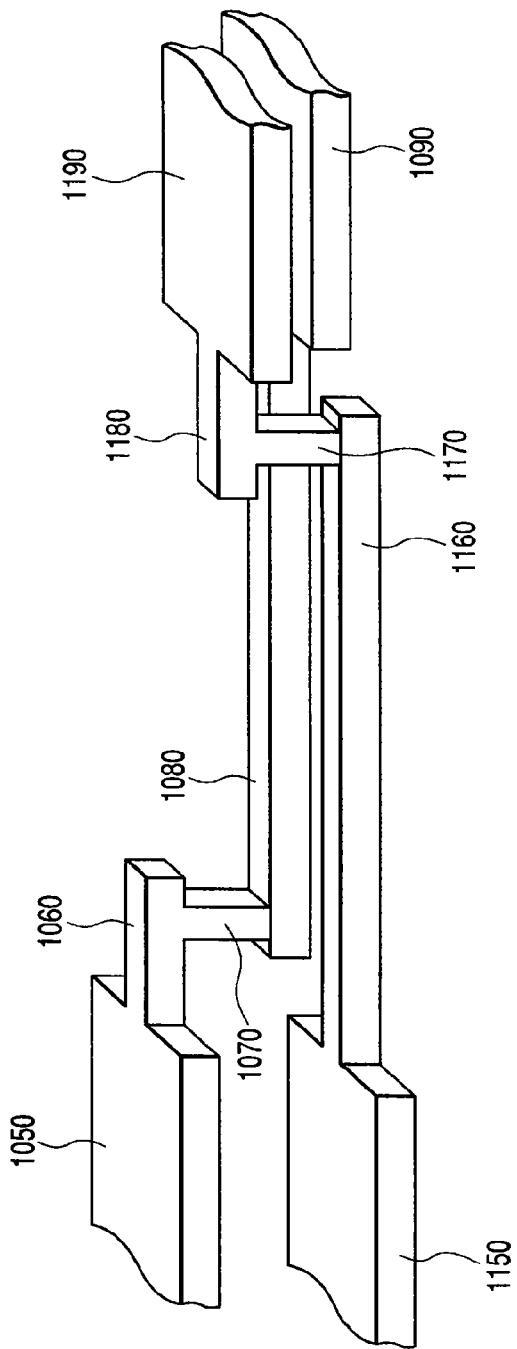
FIG. 20 is a perspective view of the electric fuse part of the modification of Embodiment 4.

Respectively, wiring layer 1060 and wiring layer 1160 may be quite long in the comparison with electric fuse parts 1070 and 1170, as shown in FIG. 20.

Embodiment 5

Next, the semiconductor device of an embodiment of the invention is explained using FIG. 21-FIG. 24.

Figure 21:
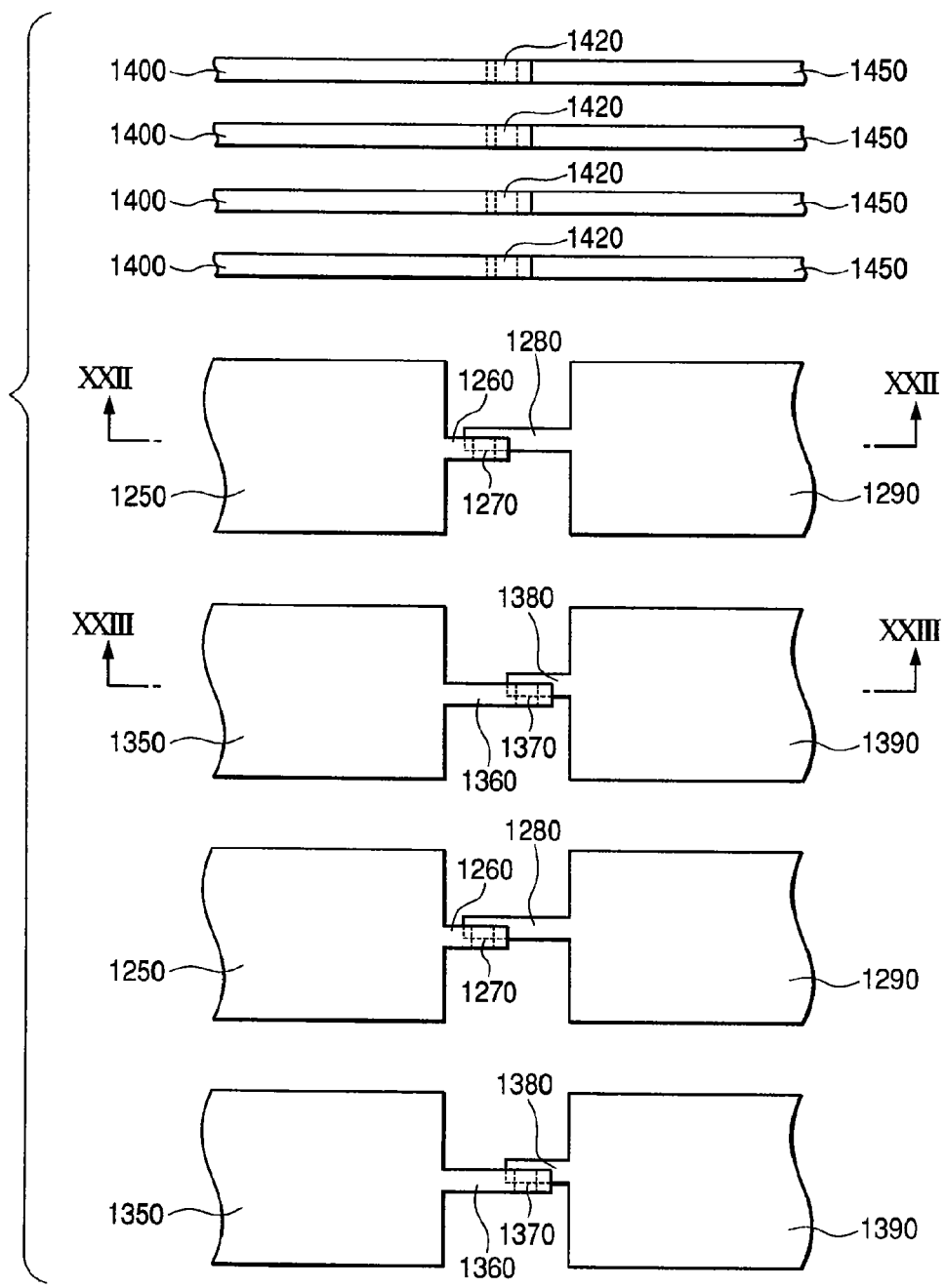
FIG. 21 is a layout drawing of the electric fuse part of Embodiment 5.
Figure 22:
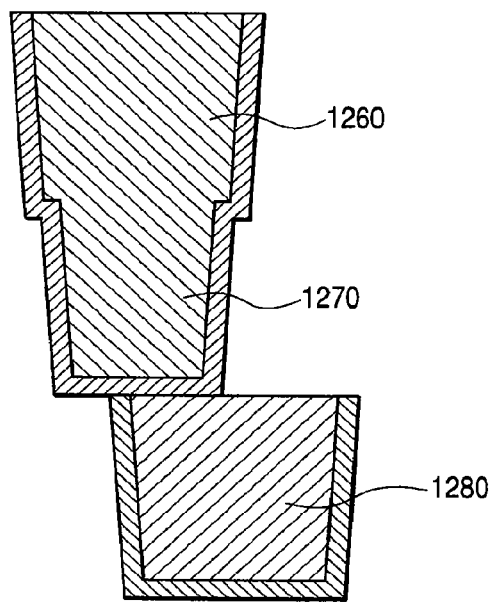
FIG. 22 is a XXII-XXII line cross-sectional view in FIG. 21.
Figure 23:
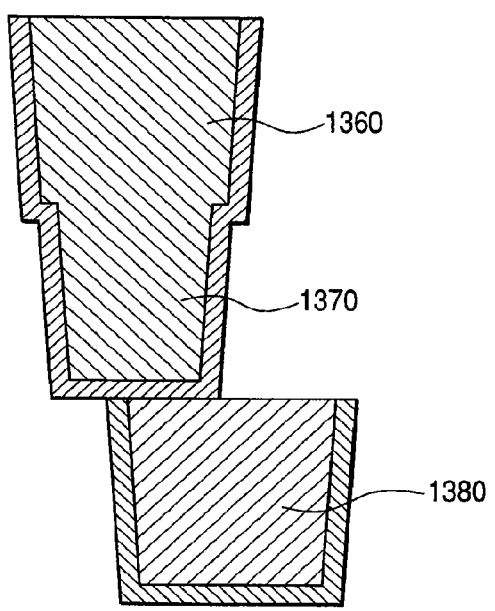
FIG. 23 is a XXIII-XXIII line cross-sectional view in FIG. 21.

As shown in FIG. 21-FIG. 23, the semiconductor device of this embodiment has the upper wiring layer 1250 prolonged in parallel to the main surface of a semiconductor substrate, and the upper wiring layer 1260 which is formed in the upper wiring layer 1250 in one in the same layer as the upper wiring layer 1250, and has width smaller than the upper wiring layer 1250. Electric fuse part 1270 prolonged toward a lower part from the upper wiring layer 1260 is formed in the upper wiring layer 1260 in one. Lower-layer wiring layer 1280 is connected to the lower end of electric fuse part 1270. In the same layer as lower-layer wiring layer 1280, lower-layer wiring layer 1290 which has bigger width than lower-layer wiring layer 1280 is formed in lower-layer wiring layer 1280 in one.

It has the upper wiring layer 1350 prolonged in parallel to the main surface of a semiconductor substrate, and the upper wiring layer 1360 which is formed in the upper wiring layer 1350 in one in the same layer as the upper wiring layer 1350, and has width smaller than the upper wiring layer 1350. Electric fuse part 1370 prolonged toward a lower part from the upper wiring layer 1360 is formed in the upper wiring layer 1360 in one. Lower-layer wiring layer 1380 is connected to the lower end of electric fuse part 1370. Lower-layer wiring layer 1390 which has bigger width than lower-layer wiring layer 1380 is formed in lower-layer wiring layer 1380 in one in the same layer as lower-layer wiring layer 1380.

The structure of the above semiconductor devices of this embodiment is the same as the structure of the semiconductor device of Embodiment 4. That is, electric fuse parts 1270 and 1370 are arranged in the shape of zigzag seeing in plan view.

Here, the problem of the semiconductor device of Embodiment 4 is explained. Like the semiconductor device of above-mentioned Embodiment 4, in order to operate a via as an electric fuse part, it is required to prevent the inconvenience that a cut section will be formed in the wiring layer connected to the via. Therefore, the structure where the temperature of a via becomes higher than the temperature of other parts by electrical connection must be formed. Therefore, the width of the wiring layer connected to the via must be equal to or more than the width of an electric fuse part.

However, when a wiring layer with big width is directly connected to a via, a wiring layer will function as a heat sink for the via as an electric fuse part. As a result, the temperature of a via will seldom rise. Then, the width of the wiring layer directly connected to a via is desirable to be small in a certain degree as shown in FIG. 16. As for the width of the wiring layer directly connected to a via, it is more preferred that it is the same as that of the width of a via. This is because lowering of the temperature of the portion near the via can be suppressed.

However, when the wiring layer which is connected to a via and which has the same width as a via becomes long too much, cutting will occur in the wiring layer of the same width as a via directly connected to the via. Therefore, the advantage that the pitch of electric fuse parts can be reduced will be spoiled. Therefore, it is preferred that the length of the wiring layer with small width connected to the via is about 1~3 μm.

In order to improve the exothermic efficiency of an electric fuse part, it is effective to enlarge current density of a cut position locally. The current density in an electric fuse part will be uniformly prescribed by the width. The width of an electric fuse part is specified according to each generation's process rule. Therefore, it is difficult to make current density increase by making small the cross-section area of an electric fuse part.

Then, in the semiconductor device of this embodiment, as shown in FIG. 21-FIG. 23, the bottom of electric fuse part 1270 and electric fuse part 1370 has protruded from lower-layer wiring layers 1280 and 1380, respectively. According to this, the contact area between electric fuse part 1270 and lower-layer wiring layer 1280 can be made smaller than the area of the cross section of electric fuse part 1270. It becomes possible to make the contact area between electric fuse part 1370 and lower-layer wiring layer 1380 smaller than the area of the cross section of electric fuse part 1370. As a result, each current density of electric fuse parts 1270 and 1370 can be improved locally. Therefore, each calorific value of electric fuse parts 1270 and 1370 can be enlarged locally. Therefore, it becomes possible to produce cutting surely in each of electric fuse parts 1270 and 1370.

However, the bottom of electric fuse parts 1270 and 1370 will be protruded from lower-layer wiring layers 1280 and 1380 also according to the error of the superposition accuracy in the manufacturing process of a semiconductor device, respectively. However, each amount of drifts from lower-layer wiring layers 1280 and 1380 of electric fuse parts 1270 and 1370 of this embodiment differs clearly from the amount of drifts of central line C4 or C5 of other vias 1420 formed in the same layer in the same step as electric fuse parts 1270 and 1370, and central line C1 or C2 of other lower-layer wiring layers 1450 as shown in FIG. 24.

In this embodiment when the amount A of drifts of central line C4 or C5 of other vias 1420, and central line C1 or C2 of other lower-layer wiring layers 1450 is zero, each amount ΔX of drifts from central line C3 of lower-layer wiring layers 1280 and 1380 of central line C6 of electric fuse parts 1270 and 1370 is larger than ⅓ of each width W of lower-layer wiring layers 1280 and 1380. According to this, in vias 1270 and 1370, cutting can be generated surely.

Figure 24:
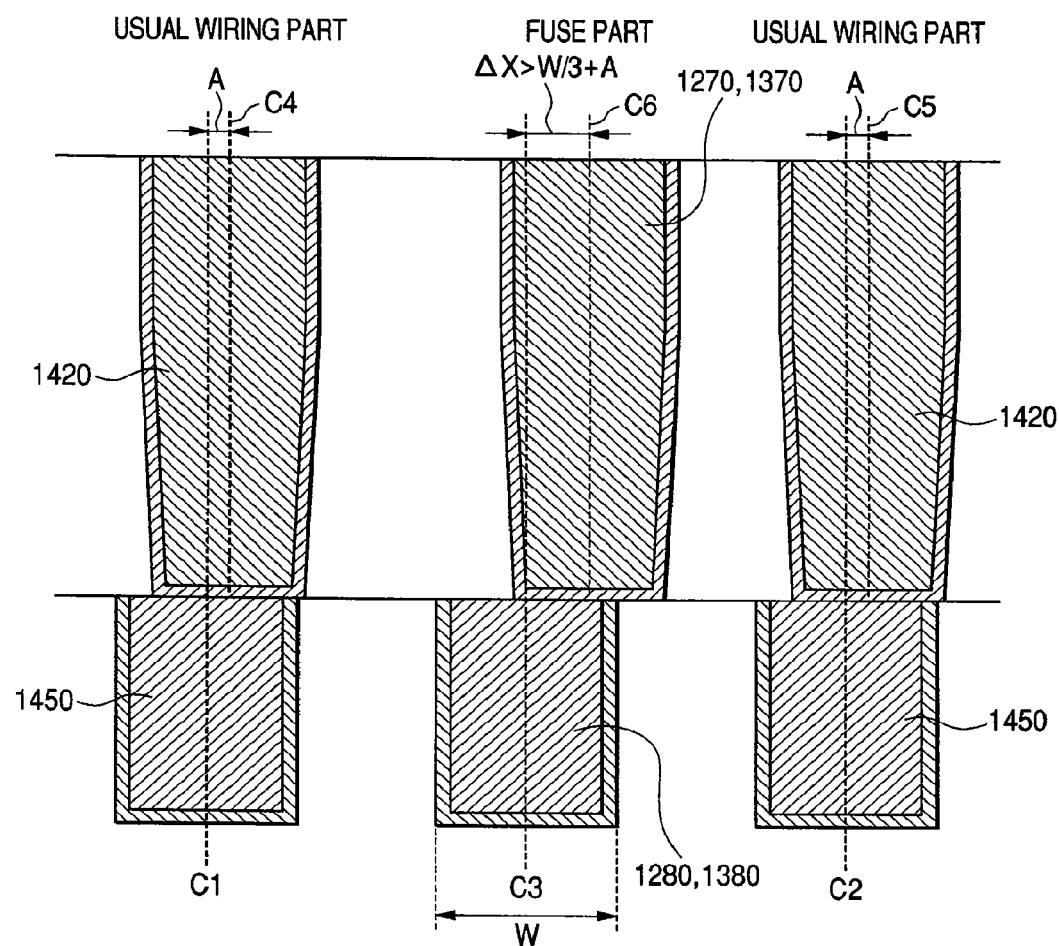
FIG. 24 is a drawing for explaining the relation between the amount of drifts to a lower-layer wiring layer of the electric fuse part of Embodiment 5, and the amount of drifts to other lower-layer wiring layers of other vias.

As shown in FIG. 24, when the amount of drifts of central line C4 or C5 of other vias 1420, and central line C1 or C2 of other lower-layer wiring layers 1450 is A, the above-mentioned amount ΔX of drifts is larger than (amount of drifts A+⅓ of width W of lower-layer wiring layer 1450).

Incidentally, it should be thought that the embodiment disclosed this time is exemplification at all points and not restrictive. The range of the present invention is not shown by the above-mentioned explanation but shown by a claim, and it is meant that all the change of the equivalent meaning and within the equivalent range as a claim is included.

What is claimed is:

1. A semiconductor device comprising:
   a plurality of upper wiring layers;
   a plurality of lower-layer wiring layers formed below the upper wiring layer; and
   a plurality of fuse parts each constructed to be electrically cut at a via by an electric current, each said fuse part provided in electrical conductivity with one said upper wiring layer and one said lower wiring layer, and each said fuse part including a via,
   wherein alternating ones of said vias are arranged in a first direction to have a zigzag shape in plan view.

2. The semiconductor device according to claim 1, wherein the fuse part is constructed to be cut at the via upon application of an electric current to the fuse part.

3. The semiconductor device according to claim 1,
   wherein each upper wiring layer includes a wide portion and a narrow portion, said wide portion having a width that is wider in the first direction than that of the narrow portion, and
   wherein each lower wiring layer includes a wide portion and a narrow portion, said wide portion having a width that is wider in the first direction than that of the narrow portion.

4. The semiconductor device according to claim 3,
wherein the width of said narrow portion of said upper wiring layer and the width of said narrow portion of said lower wiring layer are equal.

5. The semiconductor device according to claim 4,
wherein said equal widths of said narrow portions and a width of said via are equal.

6. The semiconductor device according to claim 3,
wherein the width of said wide portion of said of said upper wiring layer and the width of said wide portion of said lower wiring layer are equal.

7. The semiconductor device according to claim 1,
wherein said via and said first and second portions of said upper wiring layer are formed integrally, and
wherein said first and second portions of said lower wiring layer are formed integrally.

8. The semiconductor device according to claim 3,
wherein said wide and narrow portions of said upper wiring layer are contiguous and extend in a second direction orthogonal to said first direction, and
wherein said wide and narrow portions of said lower wiring layer are contiguous and extend in the second direction orthogonal to said first direction.

9. The semiconductor device according to claim 8,
wherein said via extends in a third direction that is orthogonal to said first and second directions.

10. The semiconductor device according to claim 3,
wherein a bottom surface of said via is provided in electrical contact with a top surface of said narrow portion of said lower wiring layer,
wherein said bottom surface of said via and said top surface of said lower wiring layer have a displaced alignment with respect to each other in the first direction,
wherein said bottom surface of said via has a contact area which covers a part of said top surface of said lower wiring layer and an overhang area which does not cover any part of said top surface of said lower wiring layer in plan view, and
wherein a width of said contact area which covers a part of said top surface is less than a width of said via and a width of said lower wiring layer in the first direction.

11. A semiconductor device, comprising:
a plurality of fuse units, each said fuse unit including a first wiring formed in a first wiring layer, a second wiring formed in a second wiring layer, and a via portion connecting between the first wiring and the second wiring,
wherein the first wiring layer is formed over the second wiring layer, and the via portion is formed in the first wiring layer, and
wherein the via portion of each fuse unit is capable of being electrically cut by an electric current flowing in the via portion.

12. The semiconductor device according to claim 11,
wherein the via portion of each fuse unit is arranged in a zigzag arrangement extending in a first direction in plan view, and
wherein the plurality of fuse units is arranged along the first direction in plan view.

13. The semiconductor device according to claim 12,
wherein the first wiring has a first wide portion having a first width in the first direction and a first narrow portion having a second width being smaller than the first width in the first direction, the first narrow portion being connected to the via portion,
wherein the second wiring has a second wide portion having a third width in the first direction and a second narrow portion having a fourth width being smaller than the third width in the first direction, the second narrow portion being connected to the via portion, and
wherein the first wide portion, the first narrow portion, the second narrow portion, and the second wide portion of the fuse unit are arranged in this order in a second direction perpendicular to the first direction.

14. The semiconductor device according to claim 12, further comprising:
a first predetermined wiring which is formed in the first wiring layer;
a second predetermined wiring which is formed in the second wiring layer; and
a predetermined via which is formed in the first wiring layer and connects the first predetermined wiring and the second predetermined wiring,
wherein a bottom of the via portion of each of the fuse units protrudes from the second wiring corresponding thereto,
wherein an amount of drift between a central line of the second wiring of each of the fuse units in cross sectional view in parallel with the first direction and a central line of the via portion of each of the fuse units in cross sectional view in parallel with the first direction is larger than an amount of drift between a central line of the second predetermined wiring in cross sectional view in parallel with the first direction and a central line of the predetermined via in cross sectional view in parallel with the first direction.

15. The semiconductor device according to claim 14,
wherein the amount of the drift between the central line of the second wiring of each of the fuse units in cross sectional view in parallel with the first direction and the central line of the via portion of each of the fuse units in cross sectional view in parallel with the first direction is larger than one-third of the width of the second wiring each of the fuse units in cross sectional view in parallel with the first direction.

16. The semiconductor device according to claim 12,
wherein the via portion of each fuse unit and the first wiring of each fuse unit are formed integrally with each other.

17. The semiconductor device according to claim 11,
wherein a bottom of the via portion of each of the fuse units protrudes from the second wiring corresponding thereto, and
wherein the plurality of fuse units is arranged along a first direction in plan view.

18. The semiconductor device according to claim 17,
wherein the first wiring has a first wide portion having a first width in the first direction and a first narrow portion having a second width smaller than the first width in the first direction, the first narrow portion being connected to the via portion,
wherein the second wiring has a second wide portion having a third width in the first direction and a second narrow portion having a fourth width smaller than the third width in the first direction, the second narrow portion being connected to the via portion, and
wherein the first wide portion, the first narrow portion, the second narrow portion, and the second wide portion of the fuse unit are arranged in this order in a second direction perpendicular to the first direction.

19. The semiconductor device according to claim 17, further comprising:
a first predetermined wiring which is formed in the first wiring layer;
a second predetermined wiring which is formed in the second wiring layer; and a predetermined via which is formed in the first wiring layer and is connected between the first predetermined wiring and the second predetermined wiring, wherein an amount of drift between a central line of the second wiring of each of the fuse units in cross sectional view in parallel with the first direction and a central line of the via portion of each of the fuse units in cross sectional view in parallel with the first direction is larger than an amount of drift between a central line of the second predetermined wiring in cross sectional view in parallel with the first direction and a central line of the predetermined via in cross sectional view in parallel with the first direction.

20. The semiconductor device according to claim 19,
wherein the amount of the drift between the central line of the second wiring of each of the fuse units in cross sectional view in parallel with the first direction and the central line of the via portion of each of the fuse units in cross sectional view in parallel with the first direction is larger than one-third of the width of the second wiring each of the fuse units in cross sectional view in parallel with the first direction.

21. The semiconductor device according to claim 17,
wherein the via portion of each fuse unit and the first wiring of each fuse unit are formed integrally with each other.

22. The semiconductor device according to claim 11,
wherein the plurality of fuse units is arranged along a first direction in plan view, and
wherein a predetermined amount of drift exists between a central line of the second wiring of each of the fuse units in cross sectional view in parallel with the first direction and a central line of the via portion of each of the fuse units in cross sectional view in parallel with the first direction.

23. A semiconductor device comprising:
a plurality of fuse units, each said fuse unit including a first wiring formed in a first wiring layer, a second wiring formed in a second wiring layer, and a via portion connected between the first wiring and the second wiring,
wherein the first wiring layer is formed over the second wiring layer, and the via portion is formed in the first wiring layer,
wherein the via portion of each fuse unit is capable of being electrically cut by an electric current flowing in the via portion,
wherein the plurality of fuse units is arranged along a first direction in plan view,
wherein the first wiring has a first wide portion having a first width in the first direction and a first narrow portion having a second width smaller than the first width in the first direction, the first narrow portion being connected to the via portion,
wherein the second wiring has a second wide portion having a third width in the first direction and a second narrow portion having a fourth width smaller than the third width in the first direction, the second narrow portion being connected to the via portion, and
wherein the first wide portion, the first narrow portion, the second narrow portion, and the second wide portion of the fuse unit are arranged in this order in a second direction perpendicular to the first direction.

24. The semiconductor device according to claim 23,
wherein a width of the via portion is equal to or smaller than the second width of the first narrow portion corresponding thereto, and the width of the via portion is equal to or smaller than the fourth width of the second narrow portion corresponding thereto.

25. The semiconductor device according claim 23,
wherein a first length of the first narrow portion is between 1 μm to 3 μm, and
wherein a second length of the second narrow portion is between 1 μm to 3 μm.

26. A semiconductor device, comprising:
a fuse unit including a first wiring formed in a first wiring layer, a second wiring formed in a second wiring layer, and a via portion connected between the first wiring and the second wiring,
wherein the first wiring layer is formed over the second wiring layer, and the via portion is formed in the first wiring layer,
wherein the via portion of fuse unit is capable of being electrically cut by an electric current flowing in the via portion,
wherein the first wiring has a first wide portion having a first width in the first direction and a first narrow portion having a second width smaller then the first width in the first direction, the first narrow portion being connected to the via portion,
wherein the second wiring has a second wide portion having a third width in the first direction and a second narrow portion having a fourth width smaller then the third width in the first direction, the second narrow portion being connected to the via portion, and
wherein the first wide portion, the first narrow portion, the second narrow portion, and the second wide portion of the fuse unit are arranged in this order in a second direction perpendicular to a first direction.

27. The semiconductor device according to claim 26, comprising:
a first predetermined wiring which is formed in the first wiring layer;
a second predetermined wiring which is formed in the second wiring layer; and
a predetermined via which is formed in the first wiring layer and is connected between the first predetermined wiring and the second predetermined wiring,
wherein a bottom of the via portion of the fuse units is protruded from the second wiring corresponding thereto, and
wherein an amount of drift between a central line of the second wiring of the fuse unit in cross sectional view in parallel with the first direction and a central line of the via portion of the fuse unit in cross sectional view in parallel with the first direction is larger than an amount of drift between a central line of the second predetermined wiring in cross sectional view in parallel with the first direction and a central line of the predetermined via in cross sectional view in parallel with the first direction.

28. The semiconductor device according to claim 27,
wherein the amount of the drift between the central line of the second wiring of the fuse unit in cross sectional view in parallel with the first direction and the central line of the via portion of the fuse unit in cross sectional view in parallel with the first direction is larger than one-third of the width of the second wiring of the fuse unit in cross sectional view in parallel with the first direction.

29. The semiconductor device according to claim 26,
wherein the via portion of fuse unit and the first wiring of fuse unit are formed integrally with each other.

30. The semiconductor device according to claim 26,
wherein a bottom of the via portion of the fuse unit protrudes from the second wiring corresponding thereto in the first direction.

31. A semiconductor device comprising:
a fuse unit including a first wiring formed in a first wiring layer, a second wiring formed in a second wiring layer, and a via portion connected between the first wiring and the second wiring,
wherein the first wiring layer is formed over the second wiring layer, and the via portion is formed in the first wiring layer,
wherein the via portion of the fuse unit is capable of being electrically cut by an electric current flowing in the via portion,
wherein the via portion of the fuse unit and the first wiring of the fuse unit are formed integrally with each other,
wherein the first wiring has a first wide portion having a first width in the first direction and a first narrow portion having a second width smaller than the first width in a first direction, the first narrow portion being connected to the via portion,
wherein the second wiring has a second wide portion having a third width in the first direction and a second narrow portion having a fourth width smaller than the third width in the first direction, the second narrow portion being connected to the via portion, and
wherein the first wide portion, the first narrow portion, the second narrow portion, and the second wide portion of the fuse unit are arranged in this order in a second direction perpendicular to the first direction.

32. The semiconductor device according to claim 31,
wherein a width of the via portion is equal to or smaller than the second width of the first narrow portion corresponding thereto, and the width of the via portion is equal to or smaller than the fourth width of the second narrow portion corresponding thereto.

33. The semiconductor device according claim 31,
wherein a first length of the first narrow portion is between 1 μm to 3 μm, and
wherein a second length of the second narrow portion is between 1 μm to 3 μm.

* * * * *